United States Patent
Iosad et al.

(10) Patent No.: US 9,274,418 B2
(45) Date of Patent: Mar. 1, 2016

(54) IMPRINT LITHOGRAPHY APPARATUS AND METHOD

(75) Inventors: Nikolay Iosad, Geldrop (NL); Pascale Anne Maury, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1247 days.

(21) Appl. No.: 12/749,823

(22) Filed: Mar. 30, 2010

(65) Prior Publication Data

US 2010/0252960 A1     Oct. 7, 2010

Related U.S. Application Data

(60) Provisional application No. 61/165,707, filed on Apr. 1, 2009.

(51) Int. Cl.
| | |
|---|---|
| *B27N 3/18* | (2006.01) |
| *G03F 7/00* | (2006.01) |
| *B82Y 10/00* | (2011.01) |
| *B82Y 40/00* | (2011.01) |

(52) U.S. Cl.
CPC ............... *G03F 7/0002* (2013.01); *B82Y 10/00* (2013.01); *B82Y 40/00* (2013.01)

(58) Field of Classification Search
USPC .................. 264/319, 284, 293, 220, 241, 132; 378/34, 35; 977/887
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,165,692 A | 12/2000 | Kanai et al. | |
| 6,334,960 B1 | 1/2002 | Willson et al. | |
| 2004/0124566 A1 | 7/2004 | Sreenivasan et al. | |
| 2005/0274693 A1 | 12/2005 | Heidari et al. | |
| 2006/0159305 A1* | 7/2006 | Simon | 382/100 |
| 2006/0196377 A1* | 9/2006 | Loopstra et al. | 101/483 |
| 2006/0272535 A1 | 12/2006 | Seki et al. | |
| 2006/0279004 A1* | 12/2006 | Suehira et al. | 257/797 |
| 2007/0054097 A1 | 3/2007 | Suehira et al. | |

(Continued)

FOREIGN PATENT DOCUMENTS

| | | |
|---|---|---|
| JP | 04-196306 | 7/1992 |
| JP | 2007-019466 | 1/2007 |

(Continued)

OTHER PUBLICATIONS

J. Haisma et al., "Mold-assisted nanolithography: A process for reliable pattern replication," J. Vac. Sci. Technol. B14 (6), Nov./Dec. 1996, pp. 4124-4128.

(Continued)

*Primary Examiner* — Stella Yi
(74) *Attorney, Agent, or Firm* — Pillsbury Winthrop Shaw Pittman LLP (57) ABSTRACT

An imprint lithography apparatus is disclosed that includes a first imprint template provided with pattern recesses and a second imprint template provided with pattern recesses, wherein the pattern recesses of the first imprint template are configured to form features on a substrate which interconnect laterally with features formed by the pattern recesses of the second imprint template, and wherein the pattern recesses of the second imprint template have a critical dimension which is three or more times greater than the critical dimension of the pattern recesses of the first imprint template.

22 Claims, 6 Drawing Sheets

(56) References Cited

U.S. PATENT DOCUMENTS

| | | | |
|---|---|---|---|
| 2007/0117389 A1 | 5/2007 | Takaki | |
| 2007/0176320 A1* | 8/2007 | Nakamura | B82Y 10/00 264/219 |
| 2007/0283883 A1 | 12/2007 | Dakshina-Murthy et al. | |
| 2008/0214010 A1* | 9/2008 | Yoneda et al. | 438/700 |
| 2008/0271628 A1* | 11/2008 | Kruijt-Stegeman | B82Y 10/00 101/463.1 |
| 2008/0296628 A1 | 12/2008 | Kaneko | |
| 2009/0047478 A1* | 2/2009 | Zhang et al. | 428/156 |
| 2009/0053471 A1* | 2/2009 | Hamedi et al. | 428/156 |
| 2009/0093121 A1* | 4/2009 | Moon | 438/696 |
| 2009/0189306 A1* | 7/2009 | Terasaki et al. | 264/238 |
| 2010/0104984 A1 | 4/2010 | Shiobara et al. | |

FOREIGN PATENT DOCUMENTS

| | | |
|---|---|---|
| JP | 2008-300715 | 12/2008 |
| JP | 2009-016696 | 1/2009 |
| JP | 2010-064788 | 3/2010 |
| JP | 2010-080010 | 4/2010 |
| JP | 2010-103415 | 5/2010 |
| KR | 10-0731737 B1 | 6/2007 |
| WO | 02/067055 A2 | 8/2002 |
| WO | 2005/057634 | 6/2005 |

OTHER PUBLICATIONS

Patrick Carlberg at al., "Nanoimprint in PDMS on glass with two-level hybrid stamp," Microelectronic Engineering 85, pp. 210-213 (May 21, 2007).

Keisuke Okuda et al., "Hybrid nanoimprint for micro-nano mixture structure," Proc. of SPIE, vol. 6533, (2007), pp. 65330R-1-65330R-6.

Jarkko Tuominen et al., "Direct patterning of micro-optical structures by combined nanoimprinting and lithography," Proc. of SPIE vol. 6992 (2008), pp. 69920B-1-69920B-8.

Japanese Office Action mailed Jan. 30, 2012 in corresponding Japanese Patent Application No. 2010-069014.

* cited by examiner

IMPRINT LITHOGRAPHY APPARATUS AND METHOD

This application claims priority and benefit under 35 U.S.C. §119(e) to U.S. Provisional Patent Application No. 61/165,707, entitled "Imprint Lithography Apparatus and Method", filed on Apr. 1, 2009. The content of that application is incorporated herein in its entirety by reference.

FIELD

The present invention relates to an imprint lithography apparatus and method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve pressing together a patterned surface of an imprint template and a layer of imprintable medium, such that the imprintable medium flows into recesses in the patterned surface and is pushed aside by protrusions on the patterned surface. The recesses define pattern features of the patterned surface of the imprint template. Typically, the imprintable medium is flowable as the patterned surface and the imprintable medium are pressed together. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate.

SUMMARY

A problem associated with imprint lithography is that imprintable medium may fail to fully fill some recesses of the imprint template, with the result that defects occur in the resulting pattern.

According to an aspect, there is provided an imprint lithography apparatus comprising a first imprint template provided with pattern recesses and a second imprint template provided with pattern recesses, wherein the pattern recesses of the first imprint template are configured to form features on a substrate which interconnect laterally with features formed by the pattern recesses of the second imprint template, and wherein the pattern recesses of the second imprint template have a critical dimension which is three or more times greater than the critical dimension of the pattern recesses of the first imprint template.

According to a further aspect, there is provided a method of imprint lithography comprising using a first imprint template to imprint features of a pattern onto a substrate, then using a second imprint template to imprint other features of the pattern onto the substrate, such that the imprinted features interconnect laterally, wherein the features formed by the first imprint template or the second imprint template have a critical dimension which is three or more times greater than a critical dimension of the features formed by the other of the first or second imprint template.

According to a further aspect, there is provided a method of imprint lithography comprising imprinting onto a substrate features of a layer of a die, then imprinting onto the substrate features of the same layer of the same die.

According to a further aspect, there is provided a first imprint template provided with pattern recesses and a second imprint template provided with pattern recesses, wherein the pattern recesses of the first imprint template are configured to form features on a substrate which interconnect laterally with features formed by the pattern recesses of the second imprint template, and wherein the pattern recesses of the second imprint template have a critical dimension which is three or more times greater than the critical dimension of the pattern recesses of the first imprint template.

According to a further aspect, there is provided an imprint template provided with pattern recesses and provided with a recessed area which is dimensioned to overlay an already patterned area of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
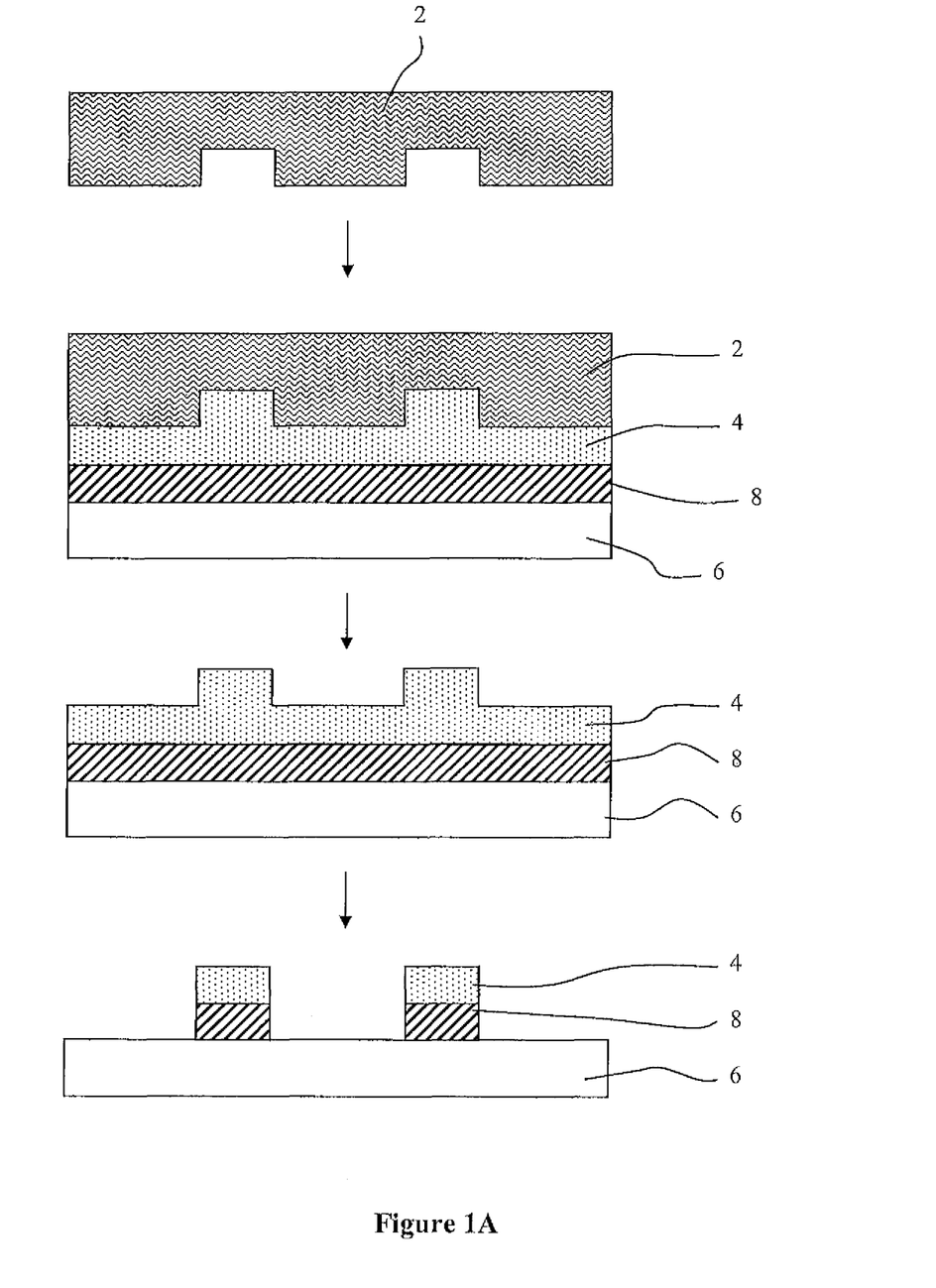
FIGS. 1A and 1b schematically depict examples of, respectively, hot imprint, and UV imprint lithography.
Figure 1B:
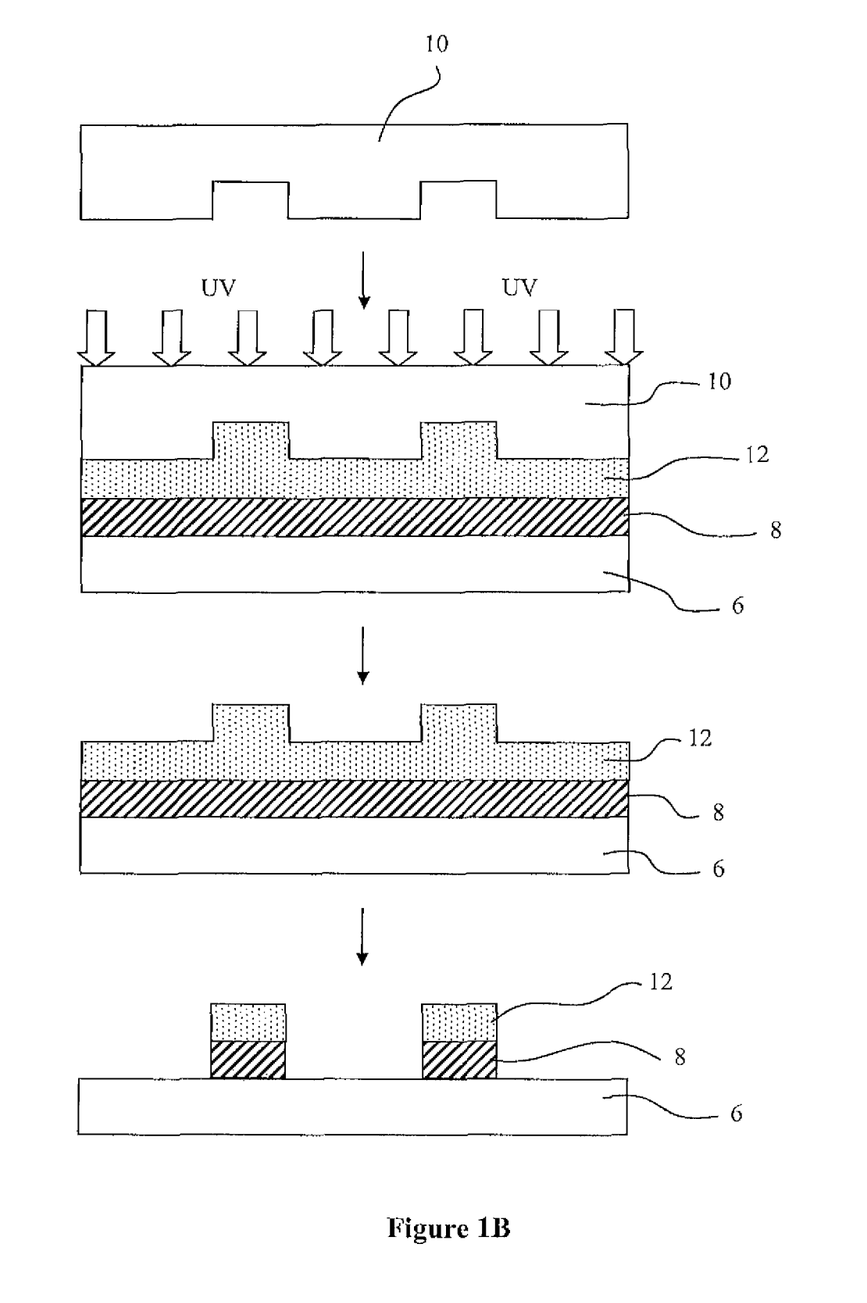

Examples of approaches to imprint lithography are schematically depicted in FIGS. 1A to 1B.

FIG. 1A shows an example of so-called hot imprint lithography (or hot embossing). In a typical hot imprint process, a template 2 is imprinted into a thermosetting or a thermoplastic imprintable medium 4, which has been cast on the surface of a substrate 6, by displacing the template toward the medium and/or displacing the medium toward the template. The imprintable medium 4 may be, for example, resin. The imprintable medium may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template comes into contact with the flowable resin and then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resin used in hot imprint lithography processes are poly (methyl methacrylate), polystyrene, poly (benzyl methacrylate) or poly (cyclohexyl methacrylate). For more information on hot imprint, see e.g., U.S. Pat. No. 4,731,155 and U.S. Pat. No. 5,772,905.

FIG. 1B shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable imprintable medium (e.g., resin) 12 in a similar manner to the process of FIG. 1A. However, instead of using heat or temperature cycling as in hot imprint, the pattern is frozen by curing the imprintable medium with UV radiation that is applied through the quartz template onto the imprintable medium. After removal of the template, the pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No, 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2:
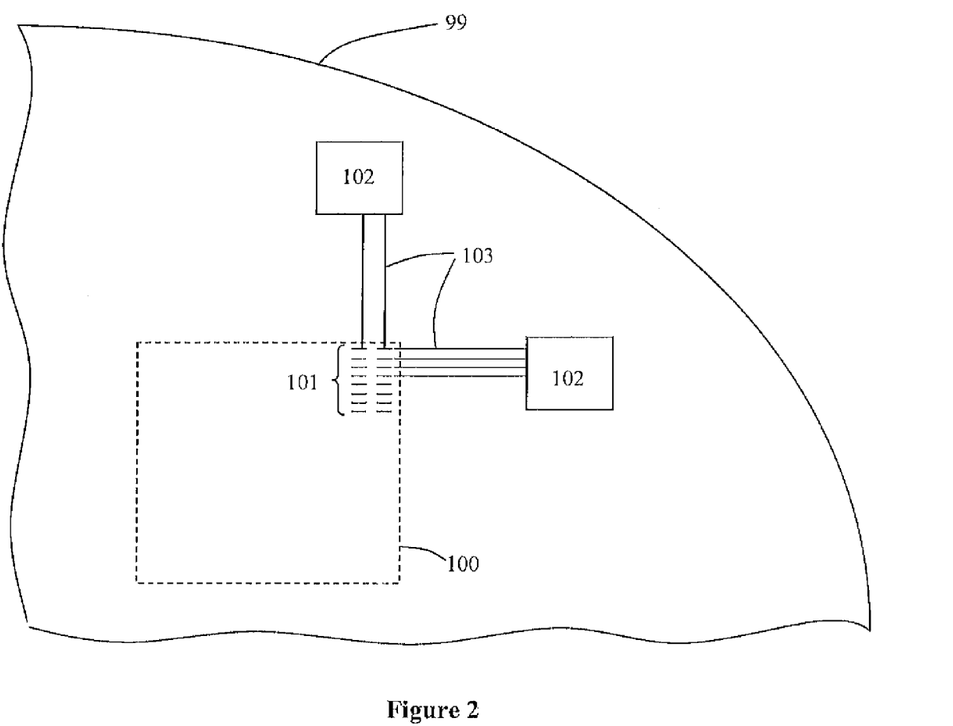
FIG. 2 schematically depicts a pattern to be formed using imprint lithography.

FIG. 2 shows schematically part of a substrate 99 upon which an example pattern has been provided. The pattern will form part of, for example, an integrated circuit, and includes a region 100 filled with features which will form, for example, transistors once the integrated circuit has been completed (the features are hereafter referred to as transistor features 101). A few of the transistor features are shown schematically as lines 101. In addition, pads 102 are shown which will enable connection of the transistors to other electrical components once the integrated circuit has been completed. Connectors 103 which connect the transistor features 101 to the pads 102 are also shown. Only a few representative transistor features 101, pads 102 and connectors 103 are shown in FIG. 2, for ease of illustration. In practice, many more transistor features, pads and connectors may be provided. The relative dimensions and the shapes of the transistor features 101, pads 102 and connectors 103 may vary significantly from what is shown in FIG. 2.

In a conventional lithographic method, all of the features shown in FIG. 2 (i.e. the transistor features 101, pads 102, and connectors 103) would be formed using a single imprint template in a single imprint step. A problem associated with this approach may arises, for instance, where there is a substantial difference in the critical dimension of the transistor features 101 and connectors 103 compared with the pads 102. The critical dimension of a pad 102 may be, for example, three or more times greater than the critical dimension of a transistor feature 101 or a connector 103 (possibly an order of magnitude larger or more).

During imprint of the pattern onto the substrate, imprintable medium flows into recesses in an imprint template which correspond to the transistor features 101, pads 102 and connectors 103 (referred to hereafter as transistor recesses, pad recesses and connector recesses respectively). The large critical dimension of a pad recess compared with a connector recess may be such that imprintable medium must flow significantly further in order to fill the center of the pad recess than to fill the connector recess. The difference of critical dimension may, for example, cause imprintable medium to preferentially flow into the pad recess and to flow away from adjacent parts of the connector recess. Alternatively, the imprintable medium may flow into the connector recess, but may fail to reach the center of the pad recess. The effect of the difference in critical dimension may vary depending upon the configuration of pattern recesses that is provided on the imprint template.

Accordingly, the presence of a recess with a larger critical dimension adjacent to a recess with a smaller critical dimension may cause one of those recesses to be under-filled by the imprintable medium. This may give rise to defects in imprinted pattern features. For example, defects could arise in the connectors 103 which may prevent the connectors from functioning correctly when the integrated circuit has been completed. Although it might be possible to reduce the occurrence of such defects by allowing a longer period of time for the imprintable medium to flow into the smaller feature recesses, this would lead to a reduction of the throughput of the lithographic apparatus (i.e. the number of substrates which are patterned per hour by the lithographic apparatus).

One or more of the above disadvantages, or one or more other disadvantages not mentioned herein, may be overcome by an embodiment of the invention in which smaller critical dimension pattern features are formed in a first imprint step using a first imprint template, and larger critical dimension pattern features are then formed in a second imprint step using a second imprint template. During the first imprint step, imprintable medium does not preferentially flow towards or away from pattern features based on their size, since only smaller critical dimension pattern features are present in the first imprint template. Similarly, during the second imprint step, imprintable medium does not preferentially flow towards or away from pattern features based on their size, since only larger critical dimension pattern features are present in the second imprint template.

Although two imprint steps are used by the embodiment, imprinting of the pattern may still be achieved more quickly than if a single imprint template were to be used. This is because imprintable medium is able to flow more readily into the pattern recesses of the two imprint templates, and so less time needs to be allocated for the flow of imprintable medium.

In an alternative embodiment of the invention, the larger critical dimension pattern features are formed in the first imprint step using an alternative first imprint template, and the smaller critical dimension pattern features are then formed in the second imprint step using an alternative second imprint template.

Figure 3A:
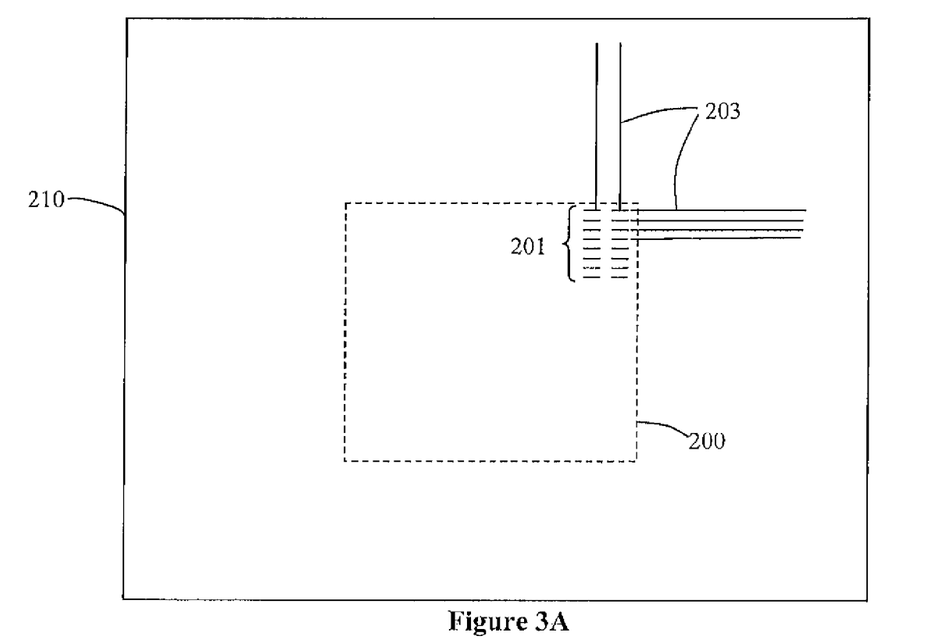
FIGS. 3A and 3B schematically depict imprint templates according to an embodiment of the invention.
Figure 3B:
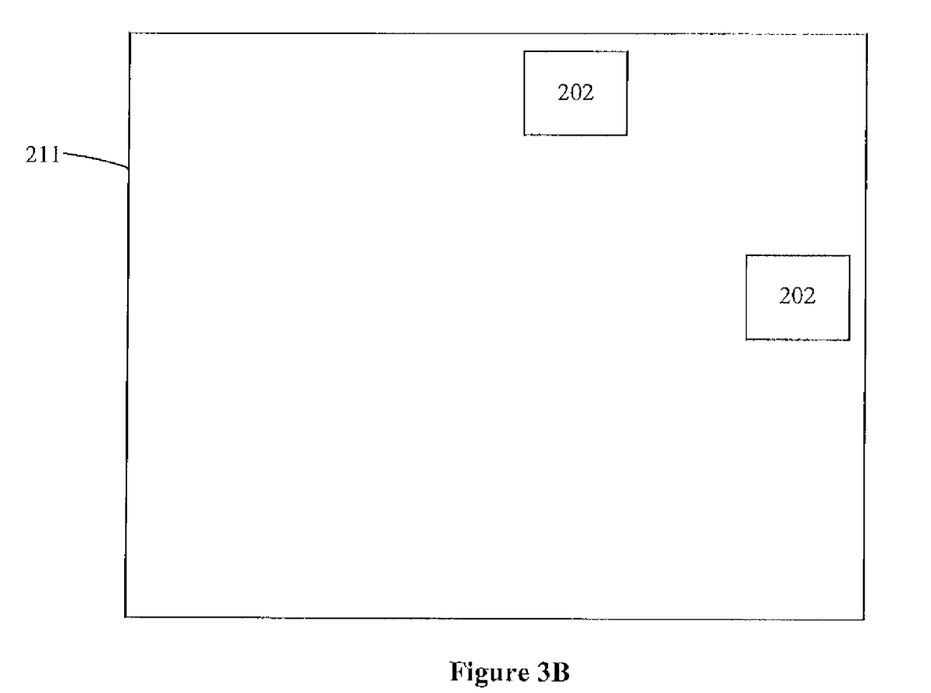

FIG. 3 shows schematically two imprint templates 210, 211 according to an embodiment of the invention, which may be used to provide a substrate with the pattern shown in FIG. 2. The first imprint template 210, which is shown in FIG. 3A, is provided with smaller critical dimension pattern features. The second imprint template 211, which is shown in FIG. 3B, is provided with larger critical dimension pattern features. Referring first to FIG. 3A, the imprint template 210 comprises a region 200 filled with transistor feature recesses 201, which will form the transistor features on the substrate. The first imprint template 210 further comprises connector recesses 203 which will form the connectors on the substrate. Referring to FIG. 3B, the second imprint template 211 is provided with pad recesses 202 which will form the pads on the substrate. The critical dimension of the pad recess 202 is three times or more greater than the critical dimension of the transistor feature recesses 201 or the connector recesses 203.

The imprint templates 210, 211 may be formed from quartz, silicon, or any other suitable material.

In use, imprintable medium is provided on a substrate. The first imprint template 210 comes into contact with the imprintable medium at a location at which it is desired to form an integrated circuit. The first imprint template 210 remains in contact with the imprintable medium for a period of time which is sufficient to allow the imprintable medium to flow into the transistor recesses 201 and connector recesses 203. The imprintable medium that has been imprinted is then cured, for example using one of the processes described further above. Imprintable medium which has not been imprinted remains uncured (selective curing is described further below). Following this, the first imprint template 210 is removed from the substrate and imprintable medium, leaving behind transistor features and connectors.

The second imprint template 211 is then aligned with the features already provided on the substrate, and comes into contact with un-cured unprintable medium. The second imprint template 211 remains in contact with the imprintable medium for a period of time which is sufficient to allow the imprintable medium to flow into the pad recesses 202. The imprintable medium is then cured. Following this, the second imprint template 211 is removed from the substrate and imprintable medium, leaving behind pads.

The combination of the first imprint template 210 and the second imprint template 211 forms the pattern shown in FIG. 2, with features 103 formed by the first imprint template interconnecting laterally with features 102 formed by the second imprint template.

The second imprint template may be provided with one or more recessed areas which are dimensioned to overlay areas of the substrate which are already patterned. This may help to ensure that the second imprint template does not damage the already patterned areas of the substrate.

The imprint process may be repeated at other locations on the substrate where it is desired to provide the same pattern. In one arrangement, patterns may be formed using the first imprint template 210 at all desired locations on the substrate, and patterns may subsequently be formed using the second imprint template 211 at those locations. In an alternative arrangement, the first and second imprint templates may be used to form a complete pattern at a first location (i.e. used consecutively at that location), then used to form a complete pattern at a second location, etc.

The imprintable medium which is imprinted by the second imprint template 211 may be provided on the substrate after imprinting using the first imprint template 210 has been completed. Alternatively, imprintable medium to be imprinted by both imprint templates 210, 211 may be provided before imprinting begins.

Alignment of the second imprint template 211 with the pattern formed by the first imprint template 210 may be achieved using a conventional alignment technique. This may include, for example, providing alignment marks on the substrate, which are measured using a suitable detector (e.g. an imaging detector).

In an embodiment, the large critical dimension of the pad recesses 202 is such that alignment of the pad recesses 202 to the connectors 103 may be achieved with a lesser degree of accuracy, without affecting the performance of the resulting integrated circuit. In an embodiment where the pad recesses 202 are large relative to the connectors 103, it may be relatively easy to ensure that they overlap with the connectors 103.

In order to improve the likelihood that the pads 102 formed by the pad recesses 202 connect with the connectors 103, the connectors 103 may be longer than would be required if the pad recesses 202 were to be perfectly aligned relative to the connectors 103. In other words, in the event of perfect alignment, the connectors 103 may extend into the area at which the pad recess 202 will form the pad 102. Similarly, the pads 102 may be dimensioned such that in the event of perfect alignment they extend transversely further than an outermost connector 103. This may reduce the likelihood that a connector 103 will end beyond the edge of a pad 102.

Figure 4:
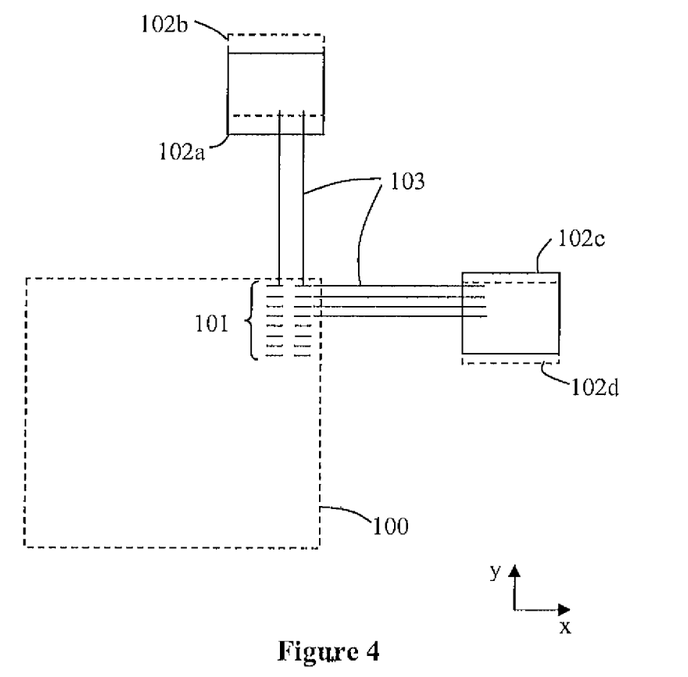
FIG. 4 schematically depicts the pattern shown in FIG. 2, including showing the effect of misalignment of an imprint template.

FIG. 4 shows schematically situations in which the pad 102 may be misaligned with regard to the connectors 103, but may still connect with the connectors and thereby allow the resulting integrated circuit to function correctly. In a first example, the correct aligned position of the pad 102a at the top of FIG. 4 is shown with a solid line. A misaligned pad 102b in which a misalignment in the positive y-direction has occurred is shown with a dotted line. Since the connectors 103 are sufficiently long to provide an overlap with the aligned position 102a of the pad, the connectors 103 still provide connection to the pad 102b which is misaligned in the y-direction. An equivalent tolerance to misalignment may be achieved by making the pad 102 longer in the y-direction.

In a second example, the aligned position of a pad 102c is shown with a continuous line. Since the pad 102c extends transversely beyond the location at which the uppermost connector 103 connects with the aligned pad 102c, some misalignment of the pad in the y-direction may be accommodated. A pad 102d which is misaligned in the minus y-direction is shown with a dotted line. It can be seen that the connectors 103 connect with the misaligned pad 102d, and consequently the resulting integrated circuit will function correctly.

In general, the pads (or other features) may have lateral dimensions which are greater than would be required to achieve lateral interconnection with features formed by the first imprint template, in the event of perfect feature alignment.

Figure 5A:
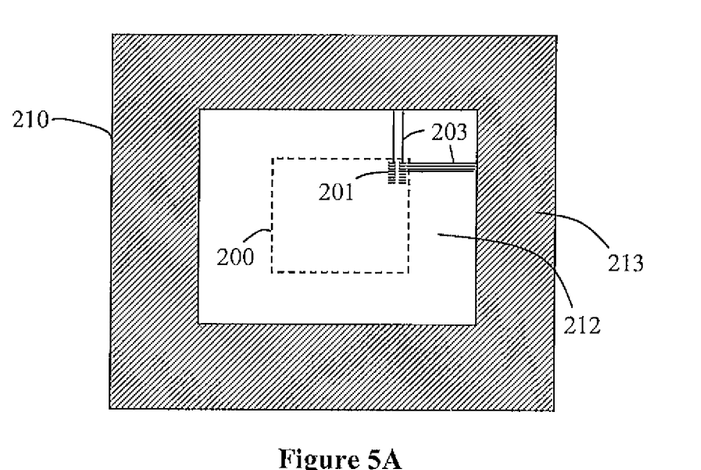
FIGS. 5A and 5B schematically depict imprint templates according to an embodiment of the invention.

One of the methods by which the imprintable medium may be cured is by using UV radiation (described further above in relation to FIG. 1B). Where UV curing is used, spatially selective curing of the imprintable medium may be achieved by making the imprint template opaque at locations where it is desired not to cure the imprintable medium. Referring to FIG. 5A, the first imprint template 210 (described above in relation to FIG. 3A) may have a central region 212 which is transparent to UV radiation, and an outer region 213 which is opaque to UV radiation. The transistor feature recesses 201 and connector recesses 203 are provided in the transparent region 212 of the first imprint template 210.

The first imprint template 210 comes into contact with imprintable medium provided on a substrate. The imprintable medium flows into the transistor feature recesses 201 and connector recesses 203, and UV radiation is then directed through the transparent region of 212 of the first imprint template. Imprintable medium which is located beneath the transparent region 212 is cured by the UV radiation. UV radiation does not pass through the opaque region 213 of the first imprint template, and consequently imprintable medium which is located beneath the opaque region is not cured.

The first imprint template 210 is removed from the substrate, and the second imprint template 211 (shown in FIG. 5B) comes into contact with the imprintable medium. Imprintable medium which has not been cured flows into the pad recesses 202 thereby forming pads, UV radiation is then directed through the second imprint template 211 and onto the imprintable medium, thereby causing the imprintable medium to be cured. Some of the UV radiation will be incident upon imprintable medium which has already been cured. However, since that imprintable medium is already cured, the UV radiation will have no effect on the already cured imprintable medium. If it were expected that the UV radiation would have an effect on the already cured imprintable medium (e.g. damaging it in some way), then an opaque region could be provided on the second imprint template 211 accordingly. The opaque region could, for example, correspond in size and position with the transparent region 212 of the first imprint template 210.

Figure 5B:
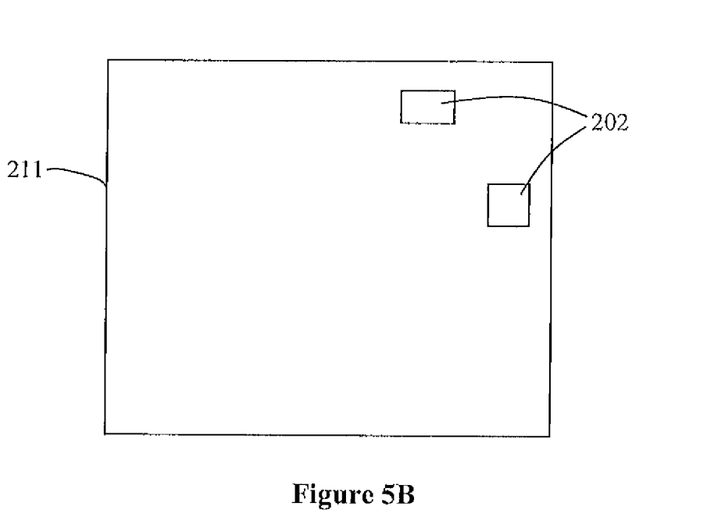

In some instances, additional imprintable medium may be applied to parts of the substrate before the second imprint template 211 comes into contact with the imprintable medium. This may be done, for example, at a position where the connectors 103 overlap with the location where the pads 102 are to be formed, in order to help ensure that flowable imprintable medium is provided at that position.

An embodiment of the invention may be implemented in a hot imprint lithography system (hot imprint lithography is described further above in relation to FIG. 1A). Where this is the case, it may be desirable to ensure that a pattern formed using the first imprint template 210 is not lost when imprinting a pattern using the second imprint template 211. For example, it might be the case that when imprinting using the second imprint template 211, heat is conducted by the substrate to locations where pattern features have already been formed. There might be a risk that this conducted heat is sufficiently strong to heat pattern features above the glass transition temperature, and thus melt those pattern features (for example, if the imprintable medium is a thermoplastic resin).

To avoid melting pattern features in this manner, two different imprintable mediums with different glass transition temperatures may be used. A first imprintable medium is provided at a location on the substrate where the first imprint template 210 will form pattern features. The first imprintable medium has a relatively high glass transition temperature. A second imprintable medium is provided at a location on the substrate where the second imprint template 211 will form pattern features. The second imprintable medium has a relatively low glass transition temperature.

The imprintable medium is heated to a temperature which is above the glass transition temperature of the first imprintable medium. The first imprint template 210 then comes into contact with the first imprintable medium. The imprintable medium is allowed to cool such that it solidifies, following which the first imprint template 210 is removed from the substrate.

The imprintable medium is then heated to the glass transition temperature of the second imprintable medium. Since this glass transition temperature is lower, the first imprintable medium remains solid. The second imprint template 211 comes into contact with the second imprintable medium. The imprintable medium is allowed to cool such that it solidifies, following which the second imprint template 211 is removed from the substrate.

The second imprintable medium may be provided on the substrate before the first imprint has taken place, or may be provided on the substrate after the first imprint has taken place.

Imprintable medium may be provided on the substrate as monomer droplets. The monomer is, for example, polymerized by UV radiation during imprint lithography, thereby forming a solid material. In one example, the monomer may be $[CH_3]$, which is polymerized to form $[CH_3]_n$. The droplets of imprintable medium which are to be used to form larger critical dimension features, such as the pads 102, may be larger than the droplets which are used to form smaller critical dimension transistor features 101 and connectors 103. Providing larger droplets of imprintable medium at locations where larger critical dimension features are to be formed may provide a degree of matching of the volume of imprintable medium to the volume of the pattern recesses. Consequently, filling of the larger critical dimension pattern recesses by the imprintable medium may be improved (e.g., the recesses may be more completely filled or may fill more quickly).

Imprintable medium may be provided on the substrate as a polymer, which may for example be spin-coated onto a substrate. Where this is the case, it might not be possible to provide different volumes of imprintable medium at different locations on the substrate.

In general, embodiments of the invention may provide improved filling of pattern recesses by imprintable medium. For example, pattern recesses may be more completely filled, or may be filled more quickly.

In the above description, reference has been made to larger critical dimension features which have a critical dimension that is three times or more greater than smaller critical dimension features, the larger critical dimension features and the smaller critical dimension features interconnecting laterally. In an embodiment, the larger critical dimension features may have a critical dimension which is 5 or more times, 10 or more times, 20 or more times, 50 or more times, or 100 or more times greater than the critical dimension of the smaller critical dimension features.

In an embodiment, the larger critical dimension features may have a critical dimension which is up to 10,000 times greater, up to 1000 times greater, up to 100 times greater, or up to 10 times greater than the critical dimension of the smaller critical dimension features.

The first and second imprint templates may be held by separate imprint template holders of the lithographic apparatus. Alternatively, they may be provided in a single imprint template holder which is configured to allow one of the imprint templates to come into contact with the imprintable medium, while keeping the other imprint template away from the imprintable medium.

Although embodiments of the invention have been described in relation to a first imprint template and a second imprint template, this is not intended to imply that the invention is limited to only two imprint templates. Embodiments of the invention may include any number of imprint templates. For example, instead of having a single imprint template with smaller critical dimension features, a plurality of imprint templates with smaller critical dimension features may be provided (e.g., two imprint templates, three imprint templates, four imprint templates, etc). These imprint templates may be, for example, independently moveable to and from contact with the imprintable medium, or linked together such that they are moveable together to and from contact with the imprintable medium. A plurality of imprint templates with larger critical dimension features may be provided in the same manner (e.g. two imprint templates, three imprint templates, four imprint templates, etc). Using a plurality of first imprint templates and a plurality of second imprint templates allows patterning of a substrate to be achieved more quickly than if a single first imprint template and a single second imprint template were to be used.

In an embodiment, three imprint templates may be provided, a first imprint template having smaller critical dimension features, a second imprint template having intermediate size critical dimension features, and a third imprint template having larger critical dimension features. In other embodiments, four or more imprint templates may be provided, each imprint template bearing features with critical dimensions that fall in a different range. There may be a substantial difference between each range of critical dimensions. For example, the second range of critical dimensions may be at least three times as great as the first range of critical dimensions, etc.

In an embodiment, a method of imprint lithography comprises imprinting onto a substrate features of a layer of a die, then imprinting onto the substrate features of the same layer of the same die. The die may, for example, be an integrated circuit, an electronic device, or some other device. A first imprint template may be used for the first imprint, and a second imprint template may be used for the second imprint. The first imprint may imprint features of a first area of the die, and the second imprint may imprint features of a second area of the die.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as one or more planarization layers or one or more anti-reflection coating layers.

The substrate may be rigid, semi-rigid, or flexible. It may be provided in a sheet-like form (e.g. provided from a roll), and may travel beneath the imprint templates. The sheet-like substrate may move beneath the imprint templates in a continuous or substantially continuous manner.

The described and illustrated embodiments are to be considered as illustrative and not restrictive in character, it being understood that only the preferred embodiments have been shown and described and that all changes and modifications that come within the scope of the inventions as defined in the claims are desired to be protected.

Further embodiments are given in below numbered clauses:

1. An imprint lithography apparatus comprising a first imprint template provided with pattern recesses and a second imprint template provided with pattern recesses, wherein the pattern recesses of the first imprint template are configured to form features on a substrate which interconnect laterally with features formed by the pattern recesses of the second imprint template, and wherein the pattern recesses of the second imprint template have a critical dimension which is three or more times greater than the critical dimension of the pattern recesses of the first imprint template.
2. The apparatus of clause 1, wherein the pattern recesses of the second imprint template have a critical dimension which is five or more times greater than the critical dimension of the pattern recesses of the first imprint template.
3. The apparatus of clause 2, wherein the pattern recesses of the second imprint template have a critical dimension which is ten or more times greater than the critical dimension of the pattern recesses of the first imprint template.
4. The apparatus of clause 1, wherein the pattern recesses of the second imprint template have a critical dimension which is 10,000 or less times greater than the critical dimension of the pattern recesses of the first imprint template.
5. The apparatus of any of the preceding clauses, wherein the first imprint template, the second imprint template, or both the first and second imprint templates, comprises an opaque region and a transparent region.
6. The apparatus of any of the preceding clauses, wherein at least some of the pattern recesses of the second imprint template have lateral dimensions which are greater than would be required to achieve lateral interconnection with features formed by the first imprint template, in the event of perfect feature alignment.
7. The apparatus of any of the preceding clauses, wherein at least some of the pattern recesses of the first imprint template are longer than would be required to achieve lateral interconnection with features formed by the second imprint template, in the event of perfect feature alignment.
8. A method of imprint lithography comprising using a first imprint template to imprint features of a pattern onto a substrate, then using a second imprint template to imprint other features of the pattern onto the substrate, such that the imprinted features interconnect laterally, wherein the features formed by the first imprint template or the second imprint template have a critical dimension which is three or more times greater than a critical dimension of the features formed by the other of the first or second imprint template.
9. The method of clause 8, wherein the features formed by the first imprint template have a critical dimension which is three times or more greater than a critical dimension of the features formed by the second imprint template.
10. The method of clause 8, wherein the features formed by the second imprint template have a critical dimension which is three or more times greater than a critical dimension of the features formed by the first imprint template.
11. The method of clause 8, wherein the features formed by the first imprint template or the second imprint template have a critical dimension which is five or more times greater than a critical dimension of the features formed by the other of the first or second imprint template.
12. The method of clause 8, wherein the features formed by the first imprint template or the second imprint template have a critical dimension which is ten or more times greater than a critical dimension of the features formed by the other of the first or second imprint template.

13. The method of any of clauses 8-12, wherein some imprintable medium on the substrate is cured by UV radiation which passes through a transparent region of the first imprint template, while other imprintable medium is not cured because UV radiation is prevented from reaching that imprintable medium by an opaque region of the first imprint template.
14. The method of any of clauses 8-13, wherein imprintable medium with a first glass transition temperature is provided on the substrate at locations which are to be imprinted by the first imprint template, and imprintable medium with a second glass transition temperature is provided on the substrate at locations which are to be imprinted by the second imprint template, the second glass transition temperature being lower than the first glass transition temperature.
15. The method of any of clauses 8-14, wherein the imprintable medium is provided on the substrate as droplets, and wherein droplets of imprintable medium which will form larger critical dimension features are larger than droplets of imprintable medium which will form smaller critical dimension features.
16. A method of imprint lithography comprising imprinting onto a substrate features of a layer of a die, then imprinting onto the substrate features of the same layer of the same die.
17. The method of clause 16, wherein a first imprint template is used for the first imprinting, and a second imprint template is used for the second imprinting.
18. The method of clause 17, wherein pattern recesses of the second imprint template have a critical dimension which is three or more times greater than the critical dimension of the pattern recesses of the first imprint template.
19. The method of clause 17, wherein pattern recesses of the first imprint template have a critical dimension which is three or more times greater than the critical dimension of the pattern recesses of the second imprint template.
20. The method of any of clauses 16-19, wherein the first imprinting imprints features of a first area of the die, and the second imprinting imprints features of a second area of the die.
21. A first imprint template provided with pattern recesses and a second imprint template provided with pattern recesses, wherein the pattern recesses of the first imprint template are configured to form features on a substrate which interconnect laterally with features formed by the pattern recesses of the second imprint template, and wherein the pattern recesses of the second imprint template have a critical dimension which is three or more times greater than the critical dimension of the pattern recesses of the first imprint template.
22. An imprint template provided with pattern recesses and provided with a recessed area which is dimensioned to overlay an already patterned area of a substrate.

The invention claimed is:

1. A method of imprint lithography comprising using a first imprint template to imprint first features of a pattern into imprintable medium on a substrate, then using a second imprint template to imprint other second features of the pattern into imprintable medium on the substrate, such that the imprinted first and second features interconnect laterally and at most partially overlap, wherein the features formed by the first imprint template or the second imprint template have a critical dimension which is three or more times greater than a critical dimension of the features formed by the other of the first or second imprint template.

2. The method of claim 1, wherein the features formed by the first imprint template or the second imprint template have a critical dimension which is five or more times greater than a critical dimension of the features formed by the other of the first or second imprint template.

3. The method of claim 1, wherein the features formed by the first imprint template or the second imprint template have a critical dimension which is ten or more times greater than a critical dimension of the features formed by the other of the first or second imprint template.

4. The method of claim 1, wherein at least part of the imprintable medium on the substrate is cured by UV radiation which passes through a transparent region of the first imprint template, while other imprintable medium is not cured because UV radiation is prevented from reaching that imprintable medium by an opaque region of the first imprint template.

5. The method of claim 1, wherein imprintable medium with a first glass transition temperature is provided on the substrate at locations which are to be imprinted by the first imprint template, and imprintable medium with a second glass transition temperature is provided on the substrate at locations which are to be imprinted by the second imprint template, the second glass transition temperature being lower than the first glass transition temperature.

6. The method of claim 1, wherein the imprintable medium is provided on the substrate as droplets, and wherein droplets of imprintable medium which will form larger critical dimension features are larger than droplets of imprintable medium which will form smaller critical dimension features.

7. A method of imprint lithography comprising imprinting, into an imprintable layer of a substrate, first features of a layer of a die, then curing the imprintable layer having the first features, and then imprinting, after the curing and prior to, or without, any imprintable medium being applied that contacts the imprintable layer, second features for the same layer of the same die into at least part of the same imprintable layer of the substrate, such that the imprinted first and second features interconnect laterally in a horizontal plane that passes through the imprinted first and second features.

8. The method of claim 7, wherein a first imprint template is used for the first imprinting, and a second imprint template is used for the second imprinting.

9. The method of claim 8, wherein the first or second imprint template comprises pattern recesses and the pattern recesses of the first or second imprint template have a critical dimension which is three or more times greater than the critical dimension of pattern recesses of the other of the first or second imprint template.

10. The method of claim 7, wherein the first imprinting imprints features of a first area of the die, and the second imprinting imprints features of a second non-overlapping area of the die.

11. The method of claim 1, wherein the features formed by the first imprint template or the second imprint template have a critical dimension which is 10,000 or less times greater than a critical dimension of the features formed by the other of the first or second imprint template.

12. The method of claim 1, wherein the first imprint template, the second imprint template, or both the first and second imprint templates, comprises an opaque region and a transparent region.

13. The method of claim 1, wherein at least some of the features formed by the first imprint template or the second imprint template have lateral dimensions which are greater than would be required to achieve lateral interconnection with features formed by the other of the first or second imprint template, in the event of perfect feature alignment.

14. The method of claim 1, wherein at least some of the features formed by the first imprint template or the second imprint template are longer than would be required to achieve lateral interconnection with features formed by the other of the first or second imprint template, in the event of perfect feature alignment.

15. The method of claim 1, wherein the first imprint template or the second imprint template has a recessed area which is dimensioned to overlay an already patterned area of the substrate.

16. A method of imprint lithography comprising using a first imprint template to imprint first features of a pattern into an imprintable layer of a substrate, then curing the imprintable layer having the first features, and then, after the curing and prior to, or without, any imprintable medium being applied that contacts the imprintable layer, using a second imprint template to imprint other second features of the pattern into at least part of the same imprintable layer of the substrate, such that the first and second imprinted features interconnect laterally in a horizontal plane passing through the imprinted first and second features.

17. The method of claim 16, wherein at least some of the features formed by the first imprint template or the second imprint template have lateral dimensions which are greater than would be required to achieve lateral interconnection with features formed by the other of the first or second imprint template, in the event of perfect feature alignment.

18. The method of claim 16, wherein at least some of the features formed by the first imprint template or the second imprint template are longer than would be required to achieve lateral interconnection with features formed by the other of the first or second imprint template, in the event of perfect feature alignment.

19. The method of claim 16, wherein the first imprint template or the second imprint template has a recessed area which is dimensioned to overlay an already patterned area of the substrate.

20. The method of claim 16, wherein the first or second imprint template comprises pattern recesses that have a critical dimension which is three or more times greater than a critical dimension of pattern recesses of the other of the first or second imprint template.

21. The method of claim 16, wherein at least some of the features imprinted by the second imprint template into the imprintable layer overlay at most partially or interleave with at least some of the features imprinted by the first imprint template into to the same imprintable layer.

22. The method of claim 7, wherein the imprinted first and second features at most partially overlap.

* * * * *